United States Patent
Kou et al.

(10) Patent No.: US 8,819,524 B2
(45) Date of Patent: Aug. 26, 2014

(54) MANUFACTURING TESTING FOR LDPC CODES

(75) Inventors: Yu Kou, San Jose, CA (US); Lingqi Zeng, Turlock, CA (US)

(73) Assignee: SK hynix memory solutions inc., San Jose, CA (US)

( * ) Notice: Subject to any disclaimer, the term of this patent is extended or adjusted under 35 U.S.C. 154(b) by 210 days.

(21) Appl. No.: 13/571,228

(22) Filed: Aug. 9, 2012

(65) Prior Publication Data
US 2012/0304036 A1  Nov. 29, 2012

Related U.S. Application Data

(63) Continuation of application No. 12/387,720, filed on May 5, 2009, now Pat. No. 8,266,497.

(60) Provisional application No. 61/196,458, filed on Oct. 17, 2008.

(51) Int. Cl.
*H03M 13/00* (2006.01)

(52) U.S. Cl.
USPC .......................................... 714/774; 714/704

(58) Field of Classification Search
USPC ................................................. 714/774, 704
See application file for complete search history.

(56) References Cited

U.S. PATENT DOCUMENTS

| | | | |
|---|---|---|---|
| 6,633,856 B2 * | 10/2003 | Richardson et al. | 706/15 |
| 6,895,547 B2 * | 5/2005 | Eleftheriou et al. | 714/801 |
| 8,286,048 B1 * | 10/2012 | Chen et al. | 714/752 |
| 2005/0283707 A1 * | 12/2005 | Sharon et al. | 714/758 |
| 2009/0106625 A1 | 4/2009 | Jun et al. | |
| 2010/0185906 A1 * | 7/2010 | Rauschmayer et al. | 714/719 |

* cited by examiner

*Primary Examiner* — M. Mujtaba K Chaudry
(74) *Attorney, Agent, or Firm* — Van Pelt, Yi & James LLP

(57) ABSTRACT

An amount of time and an error rate function are received, where the error rate function defines a relationship between a number of iterations associated with iterative decoding and an error rate. A testing error rate is determined based at least in part on the amount of time. The number of iterations which corresponds to the testing error rate in the error rate function is selected to be a testing number of iterations; the testing error rate and the testing number of iterations are associated with testing storage media using iterative decoding.

20 Claims, 6 Drawing Sheets

MANUFACTURING TESTING FOR LDPC CODES

CROSS REFERENCE TO OTHER APPLICATIONS

This application is a continuation of co-pending U.S. patent application Ser. No. 12/387,720, entitled MANUFACTURING TESTING FOR LDPC CODES filed May 5, 2009 which is incorporated herein by reference for all purposes, which claims priority to U.S. Provisional Application No. 61/196,458, entitled MARGINING FOR LDPC CODES filed Oct. 17, 2008 which is incorporated herein by reference for all purposes.

BACKGROUND OF THE INVENTION

Low-density parity-check (LDPC) codes are a type of error correcting code. LDPC codes are becoming increasingly popular in storage media, for example to encode data that is written to storage media, such as hard disk drives or Flash drives. It would be desirable to develop techniques (e.g., testing techniques) relating to LDPC for storage applications.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
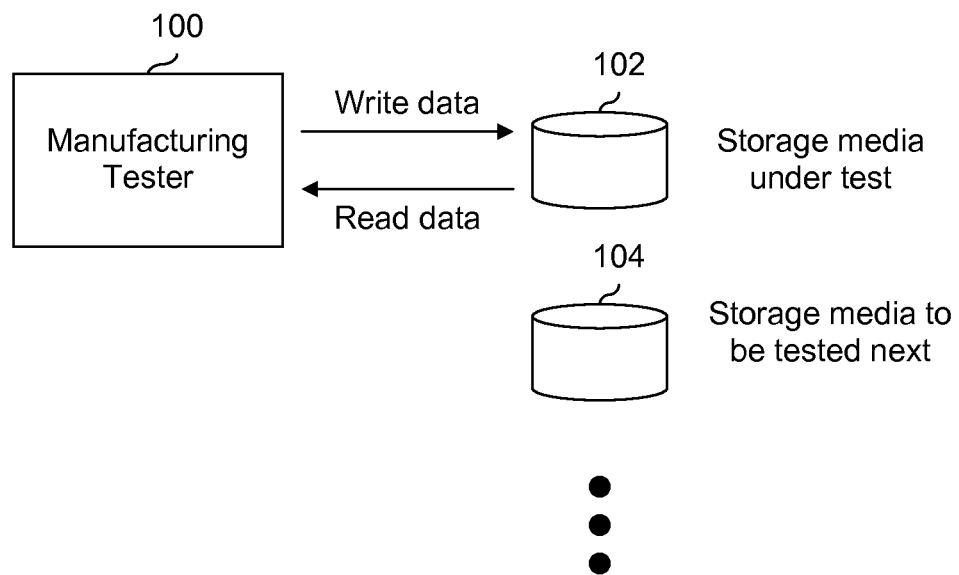
FIG. 1 is a diagram showing an embodiment of a manufacturing test system.

FIG. 1 is a diagram showing an embodiment of a manufacturing test system. In the example shown, manufacturing tester 100 is testing storage media 102. Storage media 104 is to be tested next; in various embodiments, any number of storage media is tested. In various embodiments, storage media 102 and 104 comprise various types of media. Some examples of storage media include a hard disk drive (HDD) and a Flash drive.

In one example application, storage media is tested before being distributed and/or integrated into a larger system. For example, manufacturing testing is used in some applications to ensure manufacturing defects, such as "stuck-at" faults, are below a guaranteed or desired level. Or, for storage media capable of storing multiple (e.g., voltage) levels, manufacturing testing can be used to ensure all of the levels are capable of being written and read back.

Manufacturing tester 100 writes (e.g., known) data to storage media 102 and reads it back. An error rate is determined, for example, by comparing known, written data with the read data (e.g., after any read processing); and if the error rate is satisfactorily low, the storage media 102 passes the test. For example, there is a passing error rate, and the storage media being tested must have an error rate lower than that. If the error rate is too high, storage media 102 fails.

In the embodiments described herein, the data written from manufacturing tester 100 to storage media 102 is encoded using a low-density parity-check (LDPC) code. In some embodiments, the LDPC code used during manufacturing testing is the same LDPC code as that used during a normal or operational mode. During decode of LDPC encoded data, one or more iterations are performed or otherwise used. As the number of iterations increases, the error rate tends to decrease. However, processing resources and test time increase correspondingly as the error rate decreases.

In various embodiments, manufacturing tester 100 is configured in a variety of ways. In some embodiments, manufacturing tester 100 includes components specifically configured and/or built only to perform a particular task, such as an application-specific integrated circuit (ASIC). In some embodiments, manufacturing tester 100 includes general purpose components (temporarily) configured to perform a specific task, such as a field-programmable gate array (FPGA) or (more generally) a processor and a memory coupled with the processor, where the memory is configured to provide the processor with instructions which when executed cause the processor to perform certain steps.

Figure 2:
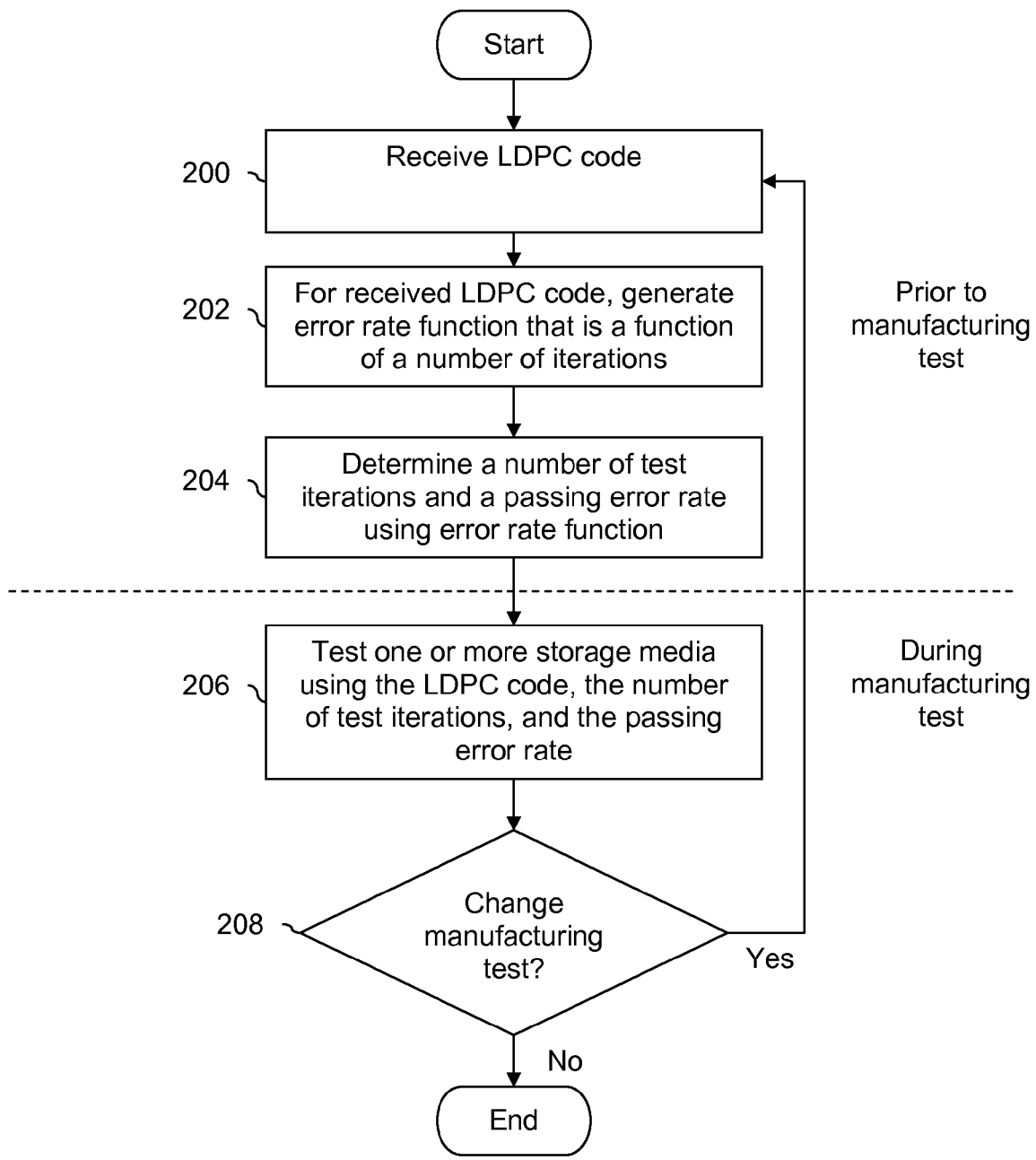
FIG. 2 is a flowchart illustrating an embodiment of process for developing a test and testing one or more storage media using the developed test.

FIG. 2 is a flowchart illustrating an embodiment of process for developing a test and testing one or more storage media using the developed test. In the example shown, the flowchart is divided into two portions: prior to manufacturing test (steps 200-204) and during manufacturing test (step 206). In some embodiments, manufacturing tester 100 in FIG. 1 performs some or all of the steps shown. For example, developing a test and performing testing in the flowchart shown both use storage media, and manufacturing tester 100 is configured to communicate with or otherwise interact with storage media.

At 200, an LDPC code is received. In some embodiments, the LDPC code is the same as that used during an operational or normal mode. For example, if the storage media is to be used in a digital music player, the LDPC code used at step 200 is the same as that used when music is being written to or read from the digital music player. For the received LDPC code, an error rate function that is a function of a number of iterations is generated at 202. An example of an error rate function is described in further detail below.

A number of test iterations and a passing error rate are determined using the error rate function at 204. For example, the error rate function may be in the form f(iterations). In some embodiments, one of the iterations and the corresponding error rate of the error rate function f(iterations) are selected to be the number of test iterations and the passing error rate, respectively. In some embodiments, some margin is included in the passing error rate. In some embodiments, determining at step 204 is based on a desired amount of test time per storage device and/or a desired number of sectors to be tested per storage device. For example, writing to and reading from the desired number of sectors will consume a certain amount of time; from this the number of iterations that keeps the amount of test time under the desired test time can be calculated.

At 206, one or more storage media are tested using the LDPC code, the number of test iterations, and the passing error rate. An embodiment is described in further detail below.

At 208, it is determined whether to change the manufacturing test. If so, an LDPC code is received at 200. In some embodiments, the LDPC code received is different from another LDPC code received at a previous iteration of step 200. In some embodiments, it is the same LDPC code.

Figure 3:
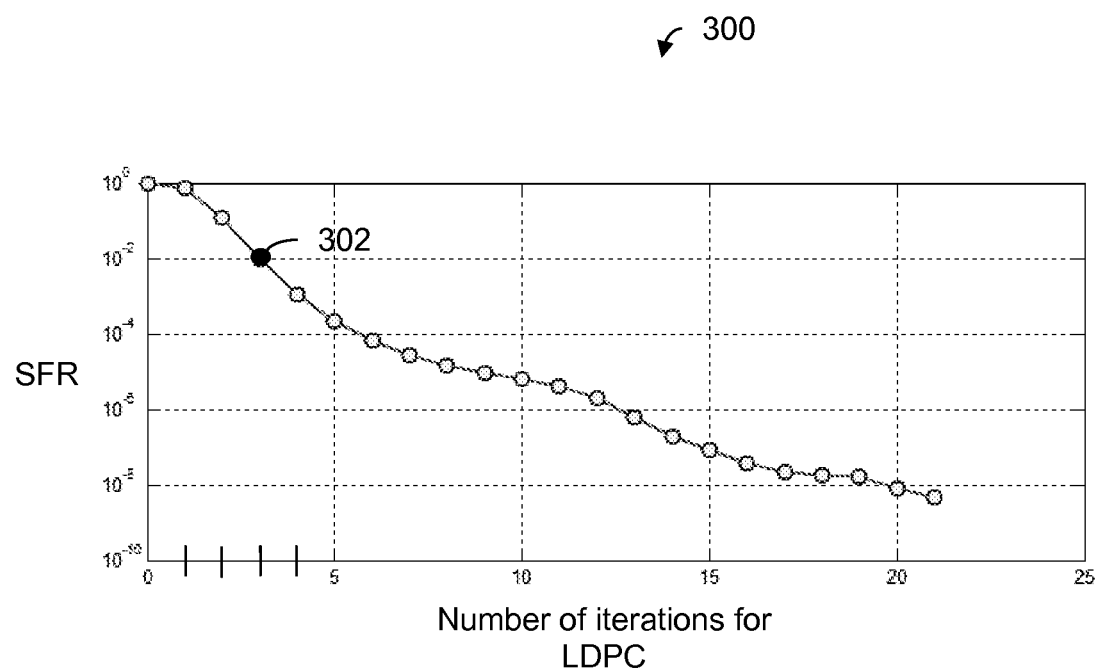
FIG. 3 is a diagram showing an embodiment of an error rate function.

FIG. 3 is a diagram showing an embodiment of an error rate function. In the example shown, error rate function 300 is a function of a number of iterations for LDPC. That is, the x-axis of the graph shows a number of iterations. The y-axis of error rate function 300 is sector failure rate (SFR). In some embodiments, some other units are used.

Referring back to FIG. 2, an error rate function (such as error rate function 300 shown in FIG. 3) is generated at step 202. Some embodiments of how to generate an error rate function are described in further detail below. At step 204 of FIG. 2, a number of test iterations and a passing error rate are determined using an error rate function. Consider, for example, point 302 in FIG. 3. Point 302 is part of or lies within function 300 and corresponds to 3 iterations and an SFR of $10^{-2}$. In one example, the number of test iterations (e.g., output at step 204) is set to 3 iterations, and the passing error rate is set to $10^{-2}$. In some embodiments, margin is included in the passing error rate (e.g., so a passing error rate strictly less than $10^{-2}$ is used in such embodiments). To continue this example, at step 206, storage media is tested using 3 iterations and a passing error rate of $10^{-2}$ (or lower). For example, after 3 LDPC iterations if the error rate is higher than $10^{-2}$, then the storage media being tested is marked as having failed manufacturing testing.

Figure 4:
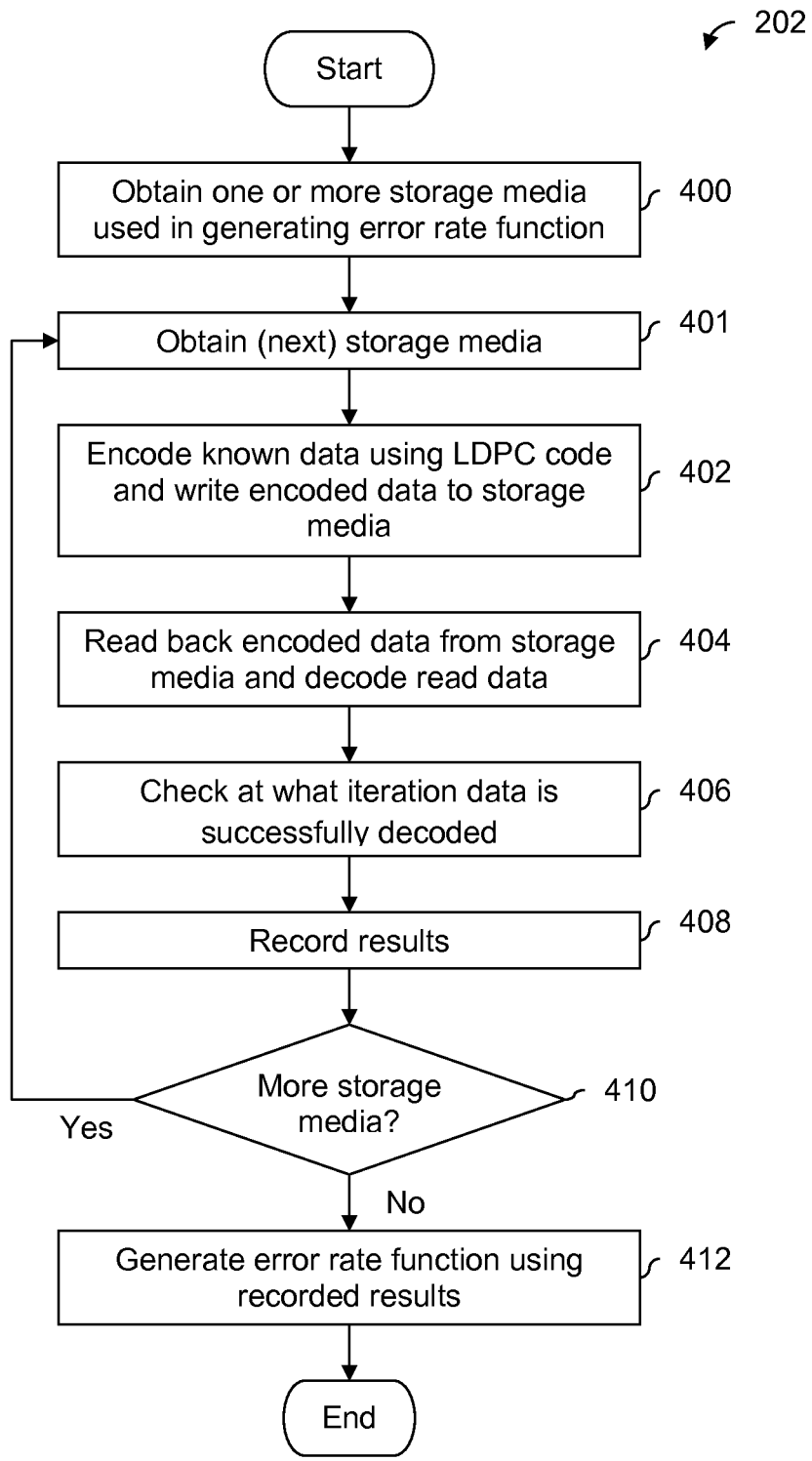
FIG. 4 is a flowchart illustrating an embodiment of a process for generating an error rate function.

FIG. 4 is a flowchart illustrating an embodiment of a process for generating an error rate function. In some embodiments, step 202 in FIG. 2 is performed as shown. In the example shown, an error rate function is generated empirically, that is, through experimentation. In some embodiments, an error rate function is obtained through some other means, for example using modeling.

At 400, one or more storage media used in generating an error rate function are obtained. For example, if HDD storage is being tested, one or more HDD devices are obtained from which the error rate function is generated. A (next) storage media is obtained at 401. At 402, known data is encoded using the LDPC code, and the encoded data is written to the storage media. In one example, a random message is generated, encoded, and written; the random message is saved for later so it can be compared to what is read back and decoded. In some embodiments, predefined patterns or messages are used.

At 404, the encoded data is read back from the storage media, and the read data is decoded. In some embodiments, decoding is performed once up to a maximum number of iterations (e.g., in FIG. 3 the maximum number of iterations is 21). Decoding is performed once and for each iteration of the decoding a corresponding error rate is determined to obtain (x0, y0), (x1, y1), etc.; this is used in generating the error rate function. This is more efficient than (for example) performing LDPC decoding for 1 iteration and obtaining a corresponding error rate, performing LDPC decoding for 2 iterations and obtaining a corresponding error rate, etc.

At 406, it is checked at what iteration the data is successfully decoded. This can be done in various ways, such as using the status of the decoder itself, using error detection code, or comparing the final data with known data, etc. In embodiments where known data is used, the decoded data is compared against the known data. For example, if there is a mismatch, an error is declared. The results are recorded at 408. In various embodiments various pieces of information are obtained and may vary based on the technique used to calculate an error rate function. In various embodiments, a number of errors, an amount of total storage media accessed during the test, error rates, and/or iterations are recorded. Some example units of the first two items include bytes, sectors, etc.

It is determined at 410 if there is more storage media. If so, the next storage media is obtained at 401. Otherwise the error rate function is generated using the recorded results at 412. In some embodiments, for each storage media, an individual error rate function is generated (e.g., similar to that shown in FIG. 3). In some such embodiments, the most conservative of the individual error rate functions is selected to be the final or output error rate function. In some embodiments, multiple individual error rate functions are averaged.

Figure 5:
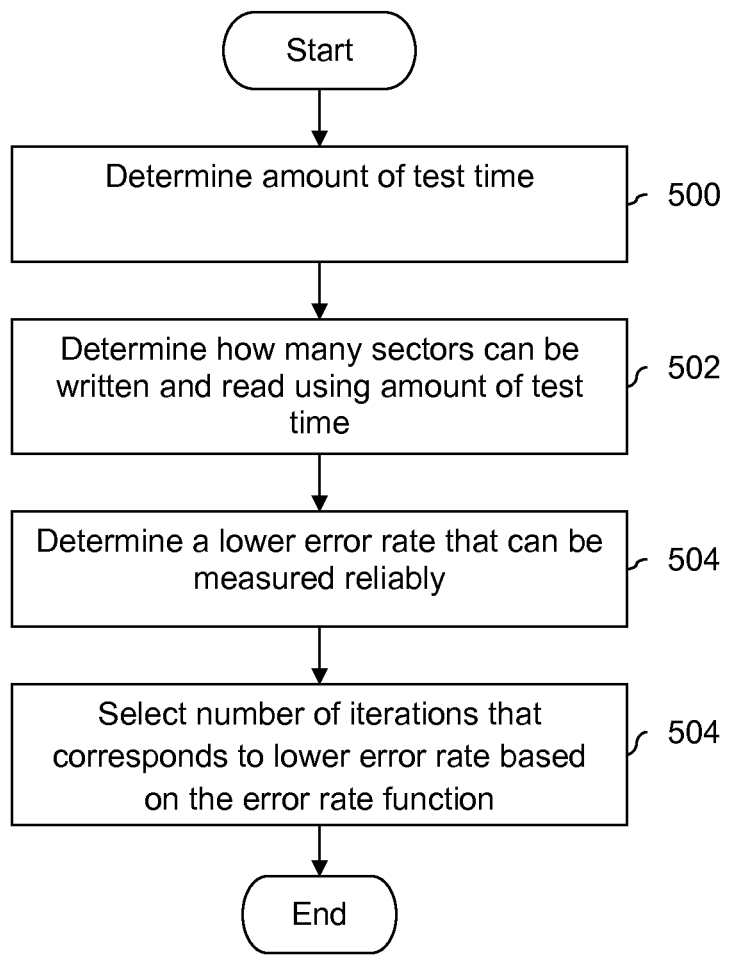
FIG. 5 is a flowchart illustrating an embodiment of a process for determining a number of test iterations and a passing error rate using an error rate function.

FIG. 5 is a flowchart illustrating an embodiment of a process for determining a number of test iterations and a passing error rate using an error rate function. In the example shown, the storage media is an HDD, and the units are sectors. In some embodiments, different units (e.g., cells, wordlines, or pages in Flash) are used. In some embodiments, step 204 of FIG. 2 is performed as shown.

At 500, an amount of test time is determined. In one example, the time consumed is determined by the manufacturer based (e.g., solely) on cost. For example, for each unit to be shipped, they need to go through certain tests. In some embodiments, any time allocated for margining is decided by a manufacturer based on their experience.

At 502, it is determined how many sectors can be written and read using the amount of test time. For example, in order to observe a certain number of errors for a given error rate, we know how many sectors we need to process=number of observation/error rate. For example, it may be desired to measure 1e-5, and 100 errors are considered enough errors. In this example, the number of sectors read/written is 100/1e-5=1e7 sectors. To read that many sectors, HDD throughput decides the final time. For example, for a 5400 RPM HDD (each revolution takes ~11 ms), each revolution has 1000 sectors and so to read 1e7 sectors, 1e7/1000*11 ms=110 seconds is needed.

At 504 a lower error rate that can be measured reliably is determined. In some embodiments, it is the lowest error rate that can be measure reliably. At 506, the number of iterations that corresponds to the lower error rate is selected based on the error rate function. For example, using the error rate function shown in FIG. 3, the x-value that corresponds to a given y-value is determined at step 506. In some embodiments, this number of iterations determined at 506 is used as the test number of iterations and if the error rate which results after manufacturing test is lower than the corresponding error rate then the storage media passes.

In one example, the following calculations (or more generally, determinations) are performed in the following order: 2 minutes is allocated→1e7 sectors can be read and 100 errors is considered sufficient→1e-5 is the error rate of practical error rate for measurement→based on the error function, a number of iterations NN that corresponds to the 1e-5 error rate is selected→if a new drive can pass 1e-5 with NN iterations, then it passes manufacturing test.

Figure 6:
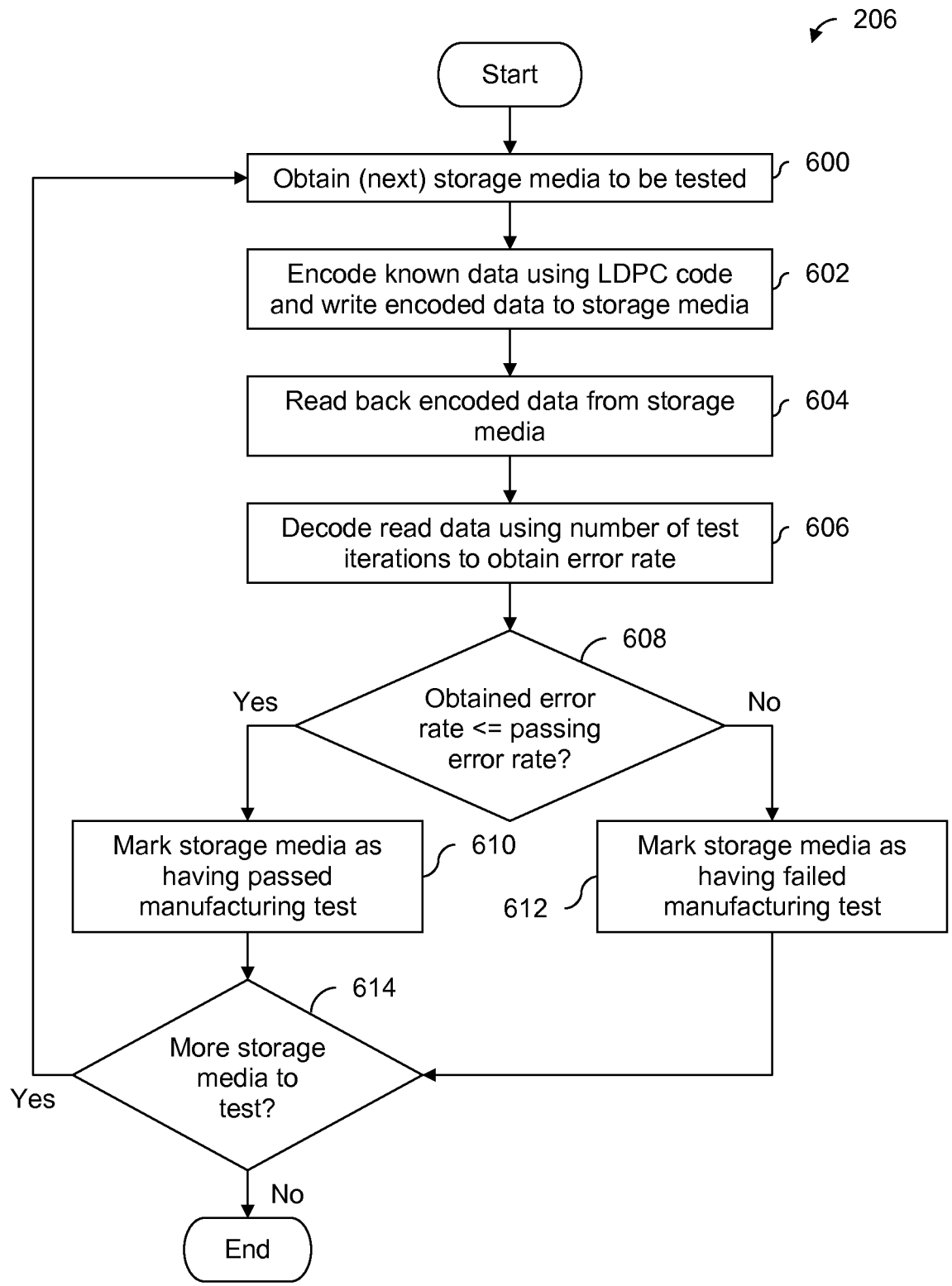
FIG. 6 is a flowchart illustrating an embodiment of process for performing a manufacturing test.

FIG. 6 is a flowchart illustrating an embodiment of process for performing a manufacturing test. In some embodiments, step 206 of FIG. 2 is performed as shown. In various embodiments, manufacturing testing is performed after storage media is manufactured and before the storage media is distributed and/or incorporated into a larger system. In some embodiments, some of the steps are similar to that shown in FIG. 4.

At 600, a (next) storage media to be tested is obtained. For example, if hard disk drives are being tested, a hard disk drive is obtained. At 602, known data is encoded using an LDPC code, and the encoded data is written to the storage media. For example, the LDPC code may be that obtained at step 200 in FIG. 2. In some embodiments, a random pattern is encoded and then written to the storage media. In some embodiments, a predefined sequence is encoded and then written to the storage media.

At 604, encoded data is read back from the storage media. For example, in FIG. 1, read data is passed from storage media 102 being tested to manufacturing tester 100. At 606, read data is decoded using the number of test iterations to obtain an error rate. In the example of FIG. 3, the number of test iterations is 3. In one example of how an error rate is calculated, the storage media is an HDD, and the units are in sectors; in one example, 100 sectors are written to and read from during a test. If X sectors of the 100 sectors are not able to be properly decoded, then the sector failure rate (SFR) is X% (i.e., X divided by 100).

It is determined at 608 whether an obtained error rate is less than or equal to a passing error rate. If so, the storage media is marked as having passed the manufacturing test at 610. Otherwise, the storage media is marked as having failed the manufacturing test at 612. For example, if the error rate obtained at step 606 is less than $10^{-2}$ (for the example scenario of FIG. 3), then the storage media passes.

After marking as appropriate at 610 or 612, it is determined at 614 if there is more storage media to test. If so, a next storage media is obtained at 600.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for determining a testing error rate and a testing number of iterations, comprising:
   using a processor to determine a testing error rate;
   obtaining an error rate function, wherein the error rate function defines a relationship between a number of iterations associated with iterative decoding and an error rate; and
   selecting that number of iterations which corresponds to the testing error rate in the error rate function to be a testing number of iterations, wherein the testing error rate and the testing number of iterations are associated with testing storage media using iterative decoding.

2. The method of claim 1 further comprising:
   obtaining an amount of testing time; and
   determining an amount of storage media which is able to be tested in the amount of testing time, wherein the testing error rate is based at least in part on the amount of storage media.

3. The method of claim 2 further comprising obtaining a desired number of error observations, wherein the testing error rate is further based at least in part on the desired number of error observations.

4. The method of claim 3, wherein the testing error rate is the desired number of error observations divided by the amount of storage media.

5. The method of claim 1, wherein the iterative decoding includes low-density parity-check (LDPC) decoding.

6. The method of claim 1, wherein the method is performed by one or more of the following: an application-specific integrated circuit (ASIC) or a field-programmable gate array (FPGA).

7. The method of claim 1, wherein the storage media includes one or more of the following: magnetic storage media, hard disk storage media, solid state storage media, or Flash storage media.

8. A system for determining a testing error rate and a testing number of iterations, comprising:
   a processor; and
   a memory coupled with the processor, wherein the memory is configured to provide the processor with instructions which when executed cause the processor to:
   determine a testing error rate;
   obtain an error rate function, wherein the error rate function defines a relationship between a number of iterations associated with iterative decoding and an error rate; and
   select that number of iterations which corresponds to the testing error rate in the error rate function to be a testing number of iterations, wherein the testing error rate and the testing number of iterations are associated with testing storage media using iterative decoding.

9. The system of claim 8, wherein the memory is further configured to provide the processor with instructions which when executed cause the processor to:
   obtain an amount of testing time; and
   determine an amount of storage media which is able to be tested in the amount of testing time, wherein the testing error rate is based at least in part on the amount of storage media.

10. The system of claim 9, wherein:
    the memory is further configured to provide the processor with instructions which when executed cause the processor to obtain a desired number of error observations; and
    the testing error rate is further based at least in part on the desired number of error observations.

11. The system of claim 10, wherein the testing error rate is the desired number of error observations divided by the amount of storage media.

12. The system of claim 8, wherein the iterative decoding includes low-density parity-check (LDPC) decoding.

13. The system of claim 8, wherein the system includes one or more of the following: an application-specific integrated circuit (ASIC) or a field-programmable gate array (FPGA).

14. The system of claim 8, wherein the storage media includes one or more of the following: magnetic storage media, hard disk storage media, solid state storage media, or Flash storage media.

15. A computer program product for determining a testing error rate and a testing number of iterations, the computer program product being embodied in a tangible computer readable storage medium and comprising computer instructions for:
    determining a testing error rate;
    obtaining an error rate function, wherein the error rate function defines a relationship between a number of iterations associated with iterative decoding and an error rate; and
    selecting that number of iterations which corresponds to the testing error rate in the error rate function to be a testing number of iterations, wherein the testing error rate and the testing number of iterations are associated with testing storage media using iterative decoding.

16. The computer program product of claim 15 further comprising computer instructions for:
    obtaining an amount of testing time; and
    determining an amount of storage media which is able to be tested in the amount of testing time, wherein the testing error rate is based at least in part on the amount of storage media.

17. The computer program product of claim 16 further comprising computer instructions for obtaining a desired number of error observations, wherein the testing error rate is further based at least in part on the desired number of error observations.

18. The computer program product of claim 17, wherein the testing error rate is the desired number of error observations divided by the amount of storage media.

19. The computer program product of claim 15, wherein the iterative decoding includes low-density parity-check (LDPC) decoding.

20. The computer program product of claim 15, wherein the storage media includes one or more of the following: magnetic storage media, hard disk storage media, solid state storage media, or Flash storage media.

* * * * *